(12) United States Patent
Xiao et al.

(10) Patent No.: US 12,136,648 B2
(45) Date of Patent: Nov. 5, 2024

(54) SUPER JUNCTION DEVICE AND METHOD FOR MAKING THE SAME

(71) Applicant: Shenzhen Sanrise-Tech Co., LTD, Guangdong (CN)

(72) Inventors: Shengan Xiao, Guangdong (CN); Dajie Zeng, Guangdong (CN)

(73) Assignee: Shenzhen Sanrise-Tech Co., LTD, Guangdong (CN)

( * ) Notice: Subject to any disclaimer, the term of this patent is extended or adjusted under 35 U.S.C. 154(b) by 479 days.

(21) Appl. No.: 17/575,816

(22) Filed: Jan. 14, 2022

(65) Prior Publication Data
US 2023/0006036 A1 Jan. 5, 2023

(30) Foreign Application Priority Data
Jul. 1, 2021 (CN) .......................... 202110742093.5

(51) Int. Cl.
*H01L 29/06* (2006.01)
*H01L 29/10* (2006.01)
*H01L 29/78* (2006.01)

(52) U.S. Cl.
CPC ...... *H01L 29/0634* (2013.01); *H01L 29/1095* (2013.01); *H01L 29/7813* (2013.01)

(58) Field of Classification Search
CPC ............. H01L 29/0634; H01L 29/1095; H01L 29/7813; H01L 29/0688; H01L 29/0878; H01L 29/66712; H01L 29/7802; H01L 29/0684; H01L 29/66666; H01L 29/7827
See application file for complete search history.

(56) References Cited

U.S. PATENT DOCUMENTS

2008/0038850 A1* 2/2008 Yamaguchi ......... H01L 29/7811
257/E29.066

FOREIGN PATENT DOCUMENTS

CN 111341830 A * 6/2020 ......... H01L 29/0634

* cited by examiner

*Primary Examiner* — Syed I Gheyas
(74) *Attorney, Agent, or Firm* — Banner & Witcoff, Ltd.

(57) ABSTRACT

The present application discloses a super junction device, comprising: an N-type redundant epitaxial layer and an N-type buffer layer sequentially formed on an N-type semiconductor substrate; wherein a trench-filling super junction structure is formed on the N-type buffer layer; a backside structure of the super junction device comprises a drain region; the N-type semiconductor substrate is removed in a backside thinning process, and the N-type redundant epitaxial layer is completely or partially removed in the backside thinning process; the resistivity of the N-type semiconductor substrate is 0.1-10 times the resistivity of a top epitaxial layer; the resistivity of the N-type redundant epitaxial layer is 0.1-10 times the resistivity of the N-type semiconductor substrate, and the resistivity of the N-type redundant epitaxial layer is lower than the resistivity of the N-type buffer layer. The present application further discloses a method for manufacturing a super junction device.

6 Claims, 4 Drawing Sheets

SUPER JUNCTION DEVICE AND METHOD FOR MAKING THE SAME

CROSS-REFERENCES TO RELATED APPLICATIONS

This application claims the priority to Chinese patent application No. 202110742093.5, filed on Jul. 1, 2021, the disclosure of which is incorporated herein by reference in its entirety.

TECHNICAL FIELD

The present application relates to the field of semiconductor integrated circuit manufacturing, in particular to a super junction device; the present application further relates to a method for manufacturing a super junction device.

BACKGROUND

The super junction structure is a structure formed by alternately arranging N-type columns and P-type columns, i.e., PN columns. If the super junction structure is used to replace an N-type drift region in a vertical double-diffused metal-oxide-semiconductor (VDMOS) device by providing a conduction path in the on-state (only the N-type column provides the path, and the P-type column does not provide the path) and withstanding the reverse bias voltage in the off-state (the PN column withstands the voltage), a super junction metal-oxide semiconductor field-effect transistor (MOSFET) may be formed. The super junction MOSFET can greatly reduce the on-resistance of the device by using a low-resistivity epitaxial layer under the condition that the reverse breakdown voltage is the same as that of the conventional VDMOS device.

A method for mass production of super junctions may be implemented by forming a trench in an N-type epitaxial layer and filling the trench with a P-type epitaxial layer so as to form PN columns arranged alternately.

For manufacturing a device with a higher reverse bias breakdown voltage or a device with a lower specific on-resistance, a smaller pitch of the PN column or an increase in the P-N depth of the device is required. In the process of filling the trench with the P-type epitaxial layer, the above requirements both cause the following problems. Firstly, the excessively large depth-width ratio of the P-type trench causes a problem in the etching of the trench; in particular, after the etching, the etching residue at the bottom of the trench cannot be fully removed, thereby causing a device failure. Secondly, the excessively large depth-width ratio of the P-type trench causes difficulty in epitaxial filling of the device, resulting in epitaxial voids or excessively long epitaxial filling time which increases the manufacturing cost. Therefore, in these cases, one method is to form the P-type column in a plurality of or two steps, wherein the height-width ratio of the P-type column is reduced in each step, so that the etching, cleaning, and filling processes of the trench can be realized with a cost advantage.

In the existing technical solution, a high-concentration substrate (for example, the resistivity thereof is 0.001-0.003 $\Omega\cdot cm$, or even lower for reducing Rdson) is generally adopted, the resistivity of which is lower than the resistivity of the N-type epitaxial layer deposited thereon, i.e., 0.5-5 $\Omega\cdot cm$, by 2 orders of magnitude. Therefore, during the process, the uniformity of the device performance is affected due to substrate impurity outdiffusion. In order to reduce the outdiffusion, the backside of the high-concentration substrate needs to be protected by an oxide film and a polysilicon film, thereby increasing the cost. In addition, since the edge portion of the wafer of the high-concentration substrate (assuming that the backside is protected) may be exposed during the process, special management is required during processes such as cleaning. For example, the high-concentration substrate is only adopted before change of a cleaning solution, which reduces the production efficiency; or after the high-concentration substrate is cleaned, the solution is changed immediately for other processes, which increases the cost.

BRIEF SUMMARY

The technical problem to be solved by the present application is to provide a super junction device, so as to eliminate the adverse effect of impurity outdiffusion of a high-concentration substrate on the super junction structure, so that the super junction structure can realize an ultra-low specific on-resistance structure and good ohmic contact can be formed on the backside. To this end, the present application further provides a method for manufacturing a super junction device.

In order to solve the above technical problem, the super junction device provided by the present application comprises:

an N-type redundant epitaxial layer and an N-type buffer layer sequentially formed on an N-type semiconductor substrate.

A super junction structure is formed on the N-type buffer layer, the super junction structure is formed by alternately arranging N-type columns and P-type columns, the P-type column is formed by a P-type semiconductor layer filling a trench, the trench is formed in a top epitaxial layer, and the N-type column is formed by the top epitaxial layer filling between the P-type columns.

A backside structure of the super junction device comprises a drain region.

The N-type semiconductor substrate is removed in a backside thinning process, the N-type redundant epitaxial layer is completely or partially removed in the backside thinning process, and the thickness of the N-type buffer layer remains intact after the backside thinning process.

The drain region is formed by means of backside N-type ion implantation after the backside thinning process.

The resistivity of the N-type semiconductor substrate is 0.1-10 times the resistivity of the top epitaxial layer, so as to ensure that doping impurity outdiffusion of the N-type semiconductor substrate does not affect the performance of the super junction structure.

The resistivity of the N-type redundant epitaxial layer is 0.1-10 times the resistivity of the N-type semiconductor substrate, the resistivity of the N-type redundant epitaxial layer is lower than the resistivity of the N-type buffer layer, and the N-type redundant epitaxial layer is used to ensure that the backside thinning process can completely remove the N-type semiconductor substrate without affecting the N-type buffer layer and ensure that the drain region can reach a required doping concentration.

In a further improvement, the resistivity of the N-type buffer layer is 0.5-2 times the resistivity of the top epitaxial layer.

In a further improvement, the resistivity of the N-type buffer layer is equal to the resistivity of the top epitaxial layer.

In a further improvement, the resistivity of the N-type redundant epitaxial layer is less than 0.2 times the resistivity of the top epitaxial layer.

In a further improvement, the resistivity of the N-type redundant epitaxial layer is 0.1 times the resistivity of the top epitaxial layer.

In a further improvement, an impurity of the backside N-type ion implantation comprises phosphorus or arsenic, and an implantation dose is $5E12\ cm^{-2}$-$1E15\ cm^{-2}$.

In a further improvement, the super junction structure is formed by stacking multiple layers of super junction substructures, each layer of super junction substructure is formed by alternately arranging P-type sub-columns and N-type sub-columns of the corresponding layer, the P-type column is formed by longitudinally stacking the P-type sub-columns of all the layers, and the N-type column is formed by longitudinally stacking the N-type sub-columns of all the layers.

The super junction structure comprises two or three or more layers of super junction substructures.

In a further improvement, the opening width of each P-type sub-column is equal to the opening width of the N-type sub-column in the same layer.

Alternatively, the opening width of each P-type sub-column is not equal to the opening width of the N-type sub-column in the same layer.

In a further improvement, when the opening width of the P-type sub-column is not equal to the opening width of the N-type sub-column in the same layer, the opening width of the P-type sub-column is greater than the opening width of the N-type sub-column in the same layer.

In a further improvement, a charge balance structure in each layer of super junction substructure is configured as: a deviation of the total amount of impurities of the P-type sub-column and the N-type sub-column is less than 5% of the total amount of the impurity in any of the P-type sub-column and the N-type sub-column.

In a further improvement, the thickness of the N-type sub-column in each layer above the second layer is configured so as to ensure that an alignment mark and an overlay accuracy mark at the bottom can be recognized after an N-type top epitaxial sub-layer corresponding to the N-type sub-column is deposited.

In a further improvement, the first layer of super junction substructure is located at the very bottom, and the second layer of super junction substructure is stacked on the first layer of super junction substructure.

In the second layer of super junction substructure, the width of a top opening of a second-layer P-type sub-column is greater than the width of a bottom opening thereof, and between the second-layer P-type sub-column and a second-layer N-type sub-column, an optimal charge balance is achieved at the bottom of the second-layer P-type sub-column.

In the first layer of super junction substructure, the width of a top opening of a first-layer P-type sub-column is greater than the width of a bottom opening thereof, and between the first-layer P-type sub-column and a first-layer N-type sub-column, an optimal charge balance is achieved at the top of the first-layer P-type sub-column.

In a further improvement, the first layer of super junction substructure is located at the very bottom, and the second layer of super junction substructure is stacked on the first layer of super junction substructure.

A trench of the first-layer P-type sub-column of the first layer of super junction substructure is an inclined trench, and a trench of the second-layer P-type sub-column of the second layer of super junction substructure is a vertical trench; the depth of the first-layer P-type sub-column is greater than the depth of the second-layer P-type sub-column by more than 10 micrometers.

In the second layer of super junction substructure, between the second-layer P-type sub-column and the second-layer N-type sub-column, a charge balance is achieved at any longitudinal position.

In a further improvement, the first layer of super junction substructure is located at the very bottom, and the second layer of super junction substructure is stacked on the first layer of super junction substructure.

A trench of the first-layer P-type sub-column of the first layer of super junction substructure is a vertical trench, and a trench of the second-layer P-type sub-column of the second layer of super junction substructure is an inclined trench; the depth of the first-layer P-type sub-column is greater than the depth of the second-layer P-type sub-column by more than 10 micrometers.

In the first layer of super junction substructure, between the first-layer P-type sub-column and the first-layer N-type sub-column, a charge balance is achieved at any longitudinal position.

In order to solve the above technical problem, the method for manufacturing a super junction device provided by the present application comprises the following steps:

step 1: sequentially forming an N-type redundant epitaxial layer and an N-type buffer layer on an N-type semiconductor substrate;

wherein the resistivity of the N-type semiconductor substrate is 0.1-10 times the resistivity of a subsequent top epitaxial layer, so as to ensure that doping impurity outdiffusion of the N-type semiconductor substrate does not affect the performance of the super junction structure; and the resistivity of the N-type redundant epitaxial layer is 0.1-10 times the resistivity of the N-type semiconductor substrate, and the resistivity of the N-type redundant epitaxial layer is lower than the resistivity of the N-type buffer layer;

step 2: forming a super junction structure on the surface of the N-type buffer layer by means of a trench filling process, wherein the super junction structure is formed by alternately arranging N-type columns and P-type columns, the P-type column is formed by a P-type semiconductor layer filling a trench, the trench is formed in the top epitaxial layer, and the N-type column is formed by the top epitaxial layer filling between the P-type columns; and step 3: completing front side processes, and then performing the following backside processes:

step 31: performing a backside thinning process, wherein the backside thinning process removes the N-type semiconductor substrate, the N-type redundant epitaxial layer is completely or partially removed in the backside thinning process, and the thickness of the N-type buffer layer remains intact after the backside thinning process; and in the backside thinning process, the N-type redundant epitaxial layer is used to ensure that the backside thinning process can completely remove the N-type semiconductor substrate without affecting the N-type buffer layer; and step 32: performing backside N-type ion implantation to form a drain region, wherein the N-type redundant epitaxial layer also ensures that the drain region can reach a required doping concentration.

In a further improvement, the resistivity of the N-type buffer layer is 0.5-2 times the resistivity of the top epitaxial layer.

In a further improvement, the resistivity of the N-type buffer layer is equal to the resistivity of the top epitaxial layer.

In a further improvement, the resistivity of the N-type redundant epitaxial layer is less than 0.2 times the resistivity of the top epitaxial layer.

In a further improvement, the resistivity of the N-type redundant epitaxial layer is 0.1 times the resistivity of the top epitaxial layer.

In a further improvement, an impurity of the backside N-type ion implantation comprises phosphorus or arsenic, and an implantation dose is 5E12 $cm^{-2}$-1E15 $cm^{-2}$.

The present application specifically configures a relationship between the impurity concentrations of the N-type semiconductor substrate and the top epitaxial layer corresponding to the super junction structure. Such the configuration can ensure that the N-type semiconductor substrate does not form the impurity outdiffusion which affects doping distribution of the super junction structure. Thus, the present application can eliminate the adverse effect of the impurity outdiffusion of the high-concentration substrate on the super junction structure, so that the super junction structure can realize an ultra-low specific on-resistance structure. For example, the pitch of a PN column of the super junction structure can be smaller and the depth can be deeper, thereby reducing the specific on-resistance of the device.

Since the present application does not reduce the specific on-resistance of the device by increasing the doping concentration of the N-type semiconductor substrate, the N-type semiconductor substrate may be completely removed in the backside thinning process, thereby eliminating the adverse effect of the N-type semiconductor substrate on the specific on-resistance of the device.

In order to completely remove the N-type semiconductor substrate without affecting the N-type buffer layer, the present application adds the N-type redundant epitaxial layer. The N-type redundant epitaxial layer can increase the process window of the backside thinning process, so that the N-type semiconductor substrate can be completely removed without affecting the N-type buffer layer.

The present application also configures relationships between the doping concentrations of the N-type redundant epitaxial layer and the N-type semiconductor substrate and between the doping concentrations of the N-type redundant epitaxial layer and the N-type buffer layer, thereby avoiding the adverse effect of an excessively high doping concentration of the N-type redundant epitaxial layer, such as a fluctuation in the resistivity of the epitaxial layer in a transition region. In addition, the drain region with a relatively high doping concentration can be formed by means of the backside N-type ion implantation, and good ohmic contact with a backside metal layer can be formed, thereby reducing the proportion of backside contact resistance in the entire on-resistance to less than 1%.

BRIEF DESCRIPTION OF THE DRAWINGS

The present application is described below in detail with reference to the drawings and specific embodiments.

DETAILED DESCRIPTION OF THE DISCLOSURE

Figure 1:
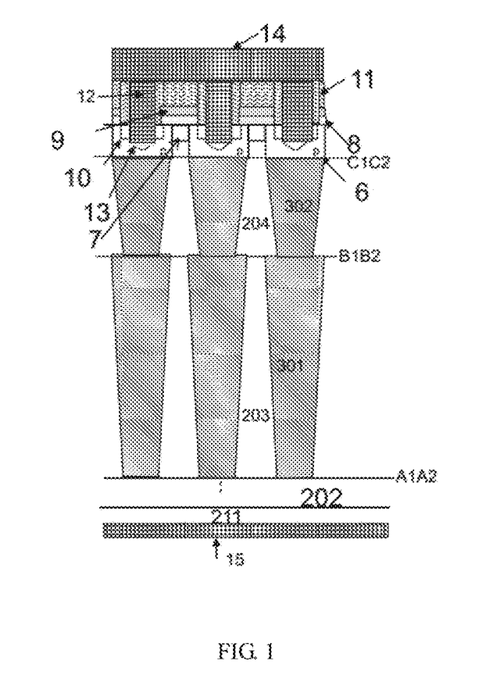
FIG. 1 is a schematic diagram of a structure of a super junction device according to an embodiment of the present application.

FIG. 1 is a schematic diagram of a structure of a super junction device according to an embodiment of the present application. The super junction device according to the embodiment of the present application includes:

an N-type redundant epitaxial layer 1 (please refer to FIG. 2) and an N-type buffer layer 202 (please refer to FIG. 2) sequentially formed on an N-type semiconductor substrate 202.

A super junction structure is formed on the N-type buffer layer 202, the super junction structure is formed by alternately arranging N-type columns and P-type columns, the P-type column is formed by a P-type semiconductor layer filling a trench, the trench is formed in a top epitaxial layer, and the N-type column is formed by the top epitaxial layer filling between the P-type columns.

A backside structure of the super junction device comprises a drain region 211.

The N-type semiconductor substrate 1 is removed in a backside thinning process.

The N-type redundant epitaxial layer 201 is partially removed in the backside thinning process. In other embodiment, the N-type redundant epitaxial layer 201 is completely removed in the backside thinning process.

The thickness of the N-type buffer layer 202 remains intact after the backside thinning process.

The drain region 211 is formed by means of backside N-type ion implantation after the backside thinning process.

The resistivity of the N-type semiconductor substrate 1 is 0.1-10 times the resistivity of the top epitaxial layer, so as to ensure that doping impurity outdiffusion of the N-type semiconductor substrate 1 does not affect the performance of the super junction structure.

The resistivity of the N-type redundant epitaxial layer 201 is 0.1-10 times the resistivity of the N-type semiconductor substrate 1, the resistivity of the N-type redundant epitaxial layer 201 is lower than the resistivity of the N-type buffer layer 202, and the N-type redundant epitaxial layer 201 is used to ensure that the backside thinning process can completely remove the N-type semiconductor substrate 1 without affecting the N-type buffer layer 202 and ensure that the drain region 211 can reach a required doping concentration.

The resistivity of the N-type buffer layer 202 is 0.5-2 times the resistivity of the top epitaxial layer. In some examples, the resistivity of the N-type buffer layer 202 is equal to the resistivity of the top epitaxial layer.

The resistivity of the N-type redundant epitaxial layer 201 is less than 0.2 times the resistivity of the top epitaxial layer. In some examples, the resistivity of the N-type redundant epitaxial layer 201 is 0.1 times the resistivity of the top epitaxial layer.

An impurity of the backside N-type ion implantation comprises phosphorus or arsenic, and an implantation dose is 5E12 $cm^{-2}$-1E15 $cm^{-2}$.

The super junction structure is formed by stacking multiple layers of super junction substructures, each layer of super junction substructure is formed by alternately arranging P-type sub-columns and N-type sub-columns of the corresponding layer, the P-type column is formed by longitudinally stacking the P-type sub-columns of all the layers, and the N-type column is formed by longitudinally stacking the N-type sub-columns of all the layers.

In the embodiment of the present application, the super junction structure includes two layers of super junction substructures. In other embodiments, the super junction structure includes more than three layers of super junction substructures.

In FIG. 1, the first layer of super junction substructure is provided between line A1A2 and line B1B2, and is formed by alternately arranging first-layer P-type sub-columns 301 and first-layer N-type sub-columns 203; the second layer of super junction substructure is provided between line B1B2 and line C1C2, and is formed by alternately arranging second-layer P-type sub-columns 302 and second-layer N-type sub-columns 204.

The opening width of each P-type sub-column is greater than the opening width of the N-type sub-column in the same layer. For example, for a super junction structure with a pitch of 9 micrometers, the top width of each P-type sub-column can be set to 5 micrometers, and the top width of each N-type sub-column can be set to 4 micrometers. For a super junction structure with a pitch of 5 micrometers, the top width of each P-type sub-column can be set to 3 micrometers, and the top width of each N-type sub-column can be set to 2 micrometers.

A charge balance structure in each layer of super junction substructure is configured as: a deviation of the total amount of impurities of the P-type sub-column and the N-type sub-column is less than 5% of the total amount of the impurity in any of the P-type sub-column and the N-type sub-column.

The thickness of the N-type sub-column in each layer above the second layer is configured so as to ensure that an alignment mark and an overlay accuracy mark at the bottom can be recognized after an N-type top epitaxial sub-layer corresponding to the N-type sub-column is deposited. For example, the thickness of the N-type sub-column in each layer above the second layer is set to 20-25 micrometers.

The first layer of super junction substructure is located at the very bottom, and the second layer of super junction substructure is stacked on the first layer of super junction sub structure.

In the embodiment of the present application, in the second layer of super junction substructure, the width of a top opening of the second-layer P-type sub-column 302 is greater than the width of a bottom opening thereof, and between the second-layer P-type sub-column 302 and a second-layer N-type sub-column 204, an optimal charge balance is achieved at the bottom of the second-layer P-type sub-column 302.

In the first layer of super junction substructure, the width of a top opening of the first-layer P-type sub-column 301 is greater than the width of a bottom opening thereof, and between the first-layer P-type sub-column 301 and a first-layer N-type sub-column 203, an optimal charge balance is achieved at the top of the first-layer P-type sub-column 301.

In this way, the optimal charge balance of the super junction structure is located at line B1B2. Such the configuration has the following benefits:

In the upper portion of the second-layer P-type sub-column 302, the amount of a P-type impurity is greater than that of an N-type impurity, and in the lower portion of the first-layer P-type sub-column 301, the amount of the N-type impurity is greater than that of the P-type impurity. During operation of the device, when Vds is increased and a breakdown occurs in a PN column, the breakdown occurs at the top of the first-layer P-type sub-column 301, i.e., near the bottom of the second-layer P-type sub-column 302, so that the current surge resistance of the device, such as EAS, in particular, the consistency of the current surge resistance, is improved.

According to such the configuration, when the impurity concentration of the P-type column deviates in the process, the electric field intensity in the entire P-type column reaches a highest value at a position near the center of the first-layer P-type sub-column 301, thus achieving stability to some extent. When an avalanche breakdown occurs at this position, holes (positively charged) in generated electron-hole pairs flow to the upper portion of the first-layer P-type sub-column 301 under the action of a vertical electric field, thereby improving the charge balance in the upper region (in this region, the amount of the P-type impurity is greater than that of the N-type impurity, and after depletion, the amount of negative charges in the P-type column is greater than that of positive charges in the N-type column; therefore, the increase in the positive charges improves the charge balance); electrons (negatively charged) in the generated electron-hole pairs flow to the bottom of the first-layer P-type sub-column 301 under the action of the vertical electric field, thereby improving the charge balance in the first-layer P-type sub-column 301 (in this region, the amount of the P-type impurity is less than that of the N-type impurity, and after depletion, the amount of negative charges in the P-type column is less than positive charges in the N-type column; therefore, the increase in the negative charges improves the charge balance). In this way, the breakdown voltage of the device is increased, thereby improving the avalanche tolerance of the device.

In other embodiments, a trench of the first-layer P-type sub-column 301 of the first layer of super junction substructure is an inclined trench, and a trench of the second-layer P-type sub-column 302 of the second layer of super junction substructure is a vertical trench; the depth of the first-layer P-type sub-column 301 is greater than the depth of the second-layer P-type sub-column 302 by more than 10 micrometers. In the second layer of super junction substructure, between the second-layer P-type sub-column 302 and the second-layer N-type sub-column 204, a charge balance is achieved at any longitudinal position. The charge balance refers to a deviation of the total amount of the impurities of the second-layer P-type sub-column 302 and the second-layer N-type sub-column 204 being less than 5% of the total amount of the impurity in any of the second-layer P-type sub-column 302 and the second-layer N-type sub-column 204, in which case a higher breakdown voltage can be obtained.

Alternatively, a trench of the first-layer P-type sub-column 301 of the first layer of super junction substructure is a vertical trench, and the depth of the first-layer P-type sub-column 301 is greater than the depth of the second-layer P-type sub-column 302 by more than 10 micrometers. In the first layer of super junction substructure, between the first-layer P-type sub-column 301 and the first-layer N-type sub-column 203, a charge balance is achieved at any longitudinal position. The charge balance refers to a deviation of the total amount of the impurities of the first-layer P-type sub-column 301 and the first-layer N-type sub-column 203 being less than 5% of the total amount of the impurity in any of the first-layer P-type sub-column 301 and the first-layer N-type sub-column 203, in which case the breakdown voltage of the device can be increased.

A front side structure of the super junction device is formed on the super junction structure. The super junction device is a super junction NMOS, the front side structure includes a plurality of super junction device cell structures, and the super junction device cell structure includes:

a P-type well 6 formed on the top of each P-type column, wherein the P-type well 6 extends into the N-type columns on both sides.

A gate structure, which is formed by stacking a gate dielectric layer, such as a gate oxide layer 8, and a polysilicon gate 9, is formed on the top of the P-type well 6. In FIG. 1, the gate oxide layers 8 and the polysilicon gates 9 on the tops of two adjacent P-type wells 6 on both sides of the N-type column are respectively connected together to form integral structures.

A source region 10 is formed in a surface region of the P-type well 6 on both sides of the polysilicon gate 9.

An interlayer film 11 covers the top of the polysilicon gate 9 and a region between the polysilicon gates 9.

A contact 12 passes through the interlayer film 11. The contact 12 shown in FIG. 1 is a contact located on the top of the source region 10, and a contact P-type implantation region 13 is formed at the bottom of the contact 12 on the top of the source region 10.

A front side metal layer 14 is patterned to form a source and a gate. The source formed by the front side metal layer 14 is shown in FIG. 1.

Generally, in order to further reduce the on-resistance, a JFET implantation region 7 formed by means of ion implantation is formed in a surface region of the N-type column between the P-type wells 6.

A drain formed by a backside metal layer 15 is formed in the drain region 211.

The present application adopts a P-N width and concentration combination structure of a P-N column of a stacked charge balance layer of the substrate with a specified concentration, i.e., resistivity, wherein the P-N column of the stacked charge balance layer is the super junction structure formed by stacking multiple layers of super junction substructures, and the P-N width refers to the widths of adjacent P-type column and N-type column. The problem of impurity outdiffusion of the high-concentration substrate is solved. In particular, in use combined with a stacked charge balance structure with an ultra-low specific on-resistance, the redundant epitaxial layer 201 with a higher concentration is added between the substrate and the buffer layer 202 of the P-N column, so as to ensure that the substrate with the specified resistivity is completely removed in the final backside grinding, leaving a portion of the redundant epitaxial layer 201 as a bottom portion the device; and the backside N-type ion implantation is performed to ensure good ohmic contact between the backside N+ region of the device and the backside metal. In this way, the outdiffusion problem caused by the high-concentration substrate is solved, while the on-resistance of the device is substantially not affected by the backside grinding process.

In the embodiment of the present application, the resistivity of the substrate 1 is maintained to be 0.1-10 times the resistivity of the N epitaxial layers 203 and 204 of the P-N column deposited thereon, and the difference in resistivity between the substrate 1 and other epitaxial layers, such as the epitaxial layers 201 and 202, shall not exceed one order of magnitude. In this way, it can be ensured that during the operation of the device, the impurity outdiffusion of the high-concentration substrate 1 does not affect the performance of the device, and an increase in the process difficulty, which is caused by a resistivity fluctuation occurring in a transition region during the deposition of the epitaxial layer 201 or 202 because the impurity concentration of the epitaxial layer 201 or 202 is excessively higher than the concentration of the substrate 1, does not occur.

In the embodiment of the present application, the concentration of the N-type semiconductor substrate 1 is not limited in theory, that is, it is not necessary to adopt a high-concentration substrate necessarily used in the prior art. If the concentration of the N-type semiconductor substrate 1 is set to ⅒-10 times the concentration of an N-type top epitaxial sub-layer 203 corresponding to the first-layer N-type sub-column 203, the interdiffusion effect of the N-type semiconductor substrate 1 on the N-type top epitaxial sub-layers 203 and 204 is negligible. In production, the concentration of the N-type semiconductor substrate 1 set to the same order of magnitude as the concentration of the N-type top epitaxial sub-layer 203 is completely achievable without additional costs. The following problems in the existing high-concentration substrate can be solved:

Outdiffusion caused by the high-concentration substrate has different effects on devices in the edge/center region of a wafer.

In the production process of the high-concentration substrate, control on mix-run is required.

Backside encapsulation is required before deposition of epitaxy with a relatively low concentration on high-concentration substrate.

The device structure in the embodiment of the present application described in further detail in combination with specific parameters:

In the embodiment of the present application, the thickness of the gate oxide layer 8 (Gox) is 700 Å.

The concentration of the N-type semiconductor substrate 1, i.e., the corresponding N-type resistivity is 0.08-8 Ω·cm.

The N-type resistivity of each of the epitaxial layers 202, 203, and 204 is 0.8 Ω·cm. Herein, different epitaxial layers are directly distinguished from each other by reference numerals.

The top width of the two-layer trench is 3 and the top width of the N-type column is 2 μm; the inclination angle of the trench is 88.8 degrees.

The depth of the first-layer P-type sub-column 301 is 30 μm, and the depth of the second-layer P-type sub-column 302 is 20 μm.

The thickness of the epitaxial layer 202 is 10 μm.

The initial thickness of the epitaxial layer 201 is 20 μm, and the resistivity is 0.08 Ω·cm.

Phosphorus ion implantation and annealing are performed after the thinning, and the implantation dose enables the phosphorus concentration of the backside surface to be 1E19 $cm^{-3}$.

The impact of the epitaxial layers 203 and 204 on the on-resistance is estimated as: 0.8*L (50 μm)/W (2 μm)=0.8*25.

The impact of the epitaxial layer 202 on the on-resistance is: 0.8*L (10 μm)/W (5 μm)=0.8*2.

The sum of the above impacts is about 0.8*27.

The thickness of the thinned epitaxial layer 201 is 10 μm, and the contribution thereof is 0.08*2, which is 1/135 of the former.

The thickness of the thinned epitaxial layer 201 is 5 μm, and the contribution thereof is 0.08*1, which is 1/270 of the former.

In the above two cases, the difference between the contributions of the epitaxial layer 201 is negligible. Therefore, the epitaxial layer 201 has a good redundancy effect.

Since the backside phosphorus ion implantation further reduces the difference between the contributions of the epitaxial layer 201 of different thicknesses to the on-resistance, the actual difference is smaller.

The embodiment of the present application specifically configures a relationship between the impurity concentrations of the N-type semiconductor substrate 1 and the top epitaxial layer corresponding to the super junction structure. Such the configuration can ensure that the N-type semiconductor substrate 1 does not form the impurity outdiffusion which affects doping distribution of the super junction structure. Thus, the present application can eliminate the adverse effect of the impurity outdiffusion of the high-concentration substrate on the super junction structure, so that the super junction structure can realize an ultra-low specific on-resistance structure. For example, the pitch of a PN column of the super junction structure can be smaller and the depth can be deeper, thereby reducing the specific on-resistance of the device.

Since the embodiment of the present application does not reduce the specific on-resistance of the device by increasing the doping concentration of the N-type semiconductor substrate 1, the N-type semiconductor substrate 1 may be completely removed in the backside thinning process, thereby eliminating the adverse effect of the N-type semiconductor substrate on the specific on-resistance of the device.

In order to completely remove the N-type semiconductor substrate 1 without affecting the N-type buffer layer 202, the embodiment of the present application adds the N-type redundant epitaxial layer 201. The N-type redundant epitaxial layer 201 can increase the process window of the backside thinning process, so that the N-type semiconductor substrate 1 can be completely removed without affecting the N-type buffer layer 202.

The embodiment of the present application also configures relationships between the doping concentrations of the N-type redundant epitaxial layer 201 and the N-type semiconductor substrate 1 and between the doping concentrations of the N-type redundant epitaxial layer 201 and the N-type buffer layer 202, thereby avoiding the adverse effect of an excessively high doping concentration of the N-type redundant epitaxial layer 201, such as a fluctuation in the resistivity of the epitaxial layer in a transition region. In addition, the drain region 211 with a relatively high doping concentration can be formed by means of the backside N-type ion implantation, and good ohmic contact with a backside metal layer can be formed, thereby reducing the proportion of backside contact resistance in the entire on-resistance to less than 1%.

Figure 2:
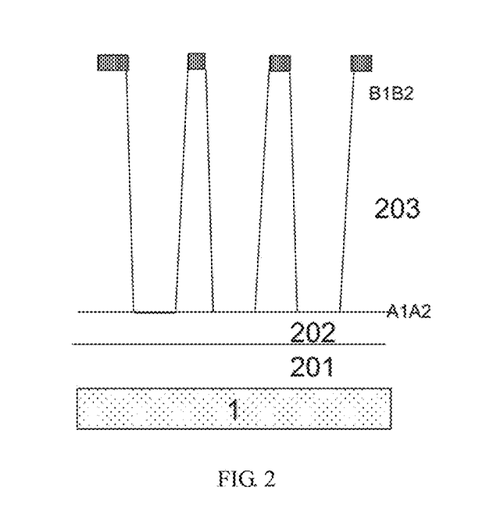
FIG. 2 to FIG. 8 are schematic diagrams of device structures in steps of a method for manufacturing a super junction device according to an embodiment of the present application.
Figure 3:
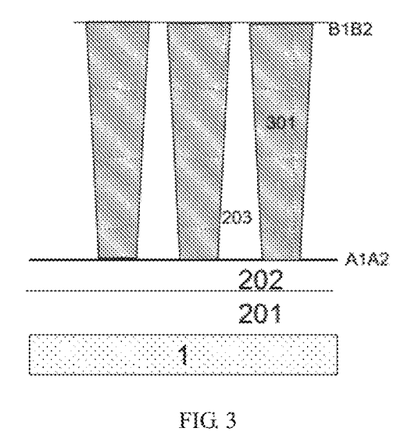

FIG. 2 to FIG. 8 are schematic diagrams of device structures in steps of a method for manufacturing a super junction device according to an embodiment of the present application. The method for manufacturing a super junction device according to the embodiment of the present application includes the following steps: Step 1. Referring to FIG. 2, an N-type redundant epitaxial layer 201 and an N-type buffer layer 202 are sequentially formed on an N-type semiconductor substrate 1.

The resistivity of the N-type semiconductor substrate 1 is 0.1-10 times the resistivity of a subsequent top epitaxial layer, so as to ensure that doping impurity outdiffusion of the N-type semiconductor substrate 1 does not affect the performance of the super junction structure.

The resistivity of the N-type redundant epitaxial layer 201 is 0.1-10 times the resistivity of the N-type semiconductor substrate 1, and the resistivity of the N-type redundant epitaxial layer 201 is lower than the resistivity of the N-type buffer layer 202.

In the method of the embodiment of the present application, the N-type semiconductor substrate 1 has relatively high resistivity, i.e., a low concentration, and has a large resistivity variation range. The resistivity of the substrate, i.e., the resistivity of the N-type semiconductor substrate 1, is set to $\frac{1}{10}$-10 times N-type epitaxial resistivity of a P-N column, i.e., the super junction structure. The N-type epitaxial resistivity is the resistivity of epitaxial layers 203 and 204 in the subsequent top epitaxial layer. For example, the resistivity of the epitaxial layers 203 and 204 of the P-N column is 0.8-8 Ω·cm; and the resistivity of the N-type semiconductor substrate 1 is 0.08-8 Ω·cm and may vary in many variation ranges. That is, the thickness of the semiconductor substrate 1 may have different thicknesses and the resistivity varies in different regions, thereby facilitating the production. The resistivity of the substrate is maintained to be 0.1-10 times the resistivity of the N epitaxial layers 203 and 204 of the P-N column deposited thereon, and the difference in resistivity between the substrate 1 and other epitaxial layers, such as the epitaxial layers 201 and 202, shall not exceed one order of magnitude. In this way, it can be ensured that during the operation of the device, the impurity outdiffusion of the high-concentration substrate does not affect the performance of the device, and an increase in the process difficulty, which is caused by a resistivity fluctuation occurring in a transition region during the epitaxial deposition because the epitaxial impurity concentration is excessively higher than the concentration of the substrate, does not occur.

In FIG. 1, the N-type redundant epitaxial layer 201 is deposited on the N-type semiconductor substrate 1, and the thickness of the N-type redundant epitaxial layer 201 may be 20 um.

The N-type buffer layer 202 is deposited on the N-type redundant epitaxial layer 201.

The resistivity of the N-type redundant epitaxial layer 201 should have a difference of 0.1-10 times the resistivity of the substrate. Compared with the resistivity of the epitaxial layer, it is lower than the resistivity of the N-type buffer layer 202 above it. Generally, the resistivity of the N-type redundant epitaxial layer 201 is $\frac{1}{10}$ of the resistivity of the N-type buffer layer 202. The thickness of this N-type redundant epitaxial layer 201 is set according to the control ability of the subsequent thinning process. It is ensured that after the thinning process, the N-type redundant epitaxial layer 201 is completely or partially removed, while the N-type buffer layer 202 remains intact for subsequent processes.

The resistivity of the N-type buffer layer 202 and the subsequent epitaxial layer 203 may be the same or different. For example, the resistivity of the N-type buffer layer 202 is 0.5-2 times the resistivity of the epitaxial layer 203.

The thickness of the N-type buffer layer 202 has some impacts on characteristics of a body diode and the on-resistance of the device, and can be set to 0-20 When there is a requirement on EAS of the device, it can generally be set to 5-20 μm.

The resistivity of the N-type redundant epitaxial layer 201 is less than 0.2 times the resistivity of the top epitaxial layer. For example, the resistivity of the N-type redundant epitaxial layer 201 is less than 0.1 times the resistivity of the top epitaxial layer.

Step 2. A super junction structure is formed on the surface of the N-type buffer layer 202 by means of a trench filling process, wherein the super junction structure is formed by alternately arranging N-type columns and P-type columns, the P-type column is formed by a P-type semiconductor layer filling a trench, the trench is formed in the top epitaxial layer, and the N-type column is formed by the top epitaxial layer filling between the P-type columns.

In the method of the embodiment of the present application, the super junction structure is formed by stacking multiple layers of super junction substructures, each layer of super junction substructure is formed by alternately arranging P-type sub-columns and N-type sub-columns of the corresponding layer, the P-type column is formed by longitudinally stacking the P-type sub-columns of all the layers, and the N-type column is formed by longitudinally stacking the N-type sub-columns of all the layers.

In the following description, for example, the super junction structure includes two layers of super junction substructures. In other embodiments, there may be three or more layers of super junction substructures, so that the difficulty of the trench filling process of each layer is reduced, or BVdss of the device is increased. The formation process of the super junction structure with a two-layer stacked structure includes the following sub-steps:

Step 21. Epitaxial growth is performed, referring to FIG. 1, including: forming an N-type top epitaxial sub-layer 203 on the N-type buffer layer 202, which is referred to as the epitaxial layer 203.

The bottom surface of the epitaxial layer 203 is shown by line A1A2, and the top surface is shown by line B1B2.

Step 22. Trench etching is performed, including: depositing a hard mask layer formed by stacking a bottom oxide film, an intermediate silicon nitride film, and a top oxide film on the top surface of the epitaxial layer 203. After the hard mask layer in an open region of lithography is etched away by means of lithography and etching, silicon etching is performed to form a trench of the first layer of super junction structure, i.e., the first-layer trench, and the bottom of the first-layer trench reaches the bottom of the epitaxial layer 203.

Step 23. Trench filling is performed, referring to FIG. 2, including: when the etching is completed, etching away the top oxide film and the intermediate nitride film in the hard mask layer by means of dry or wet etching, leaving the bottom oxide film as a hard mask of trench filling silicon. Then, referring to FIG. 3, the first trench is fully filled with a P-type semiconductor layer, such as a P-type silicon epitaxial layer. The silicon on the surface is fully removed by means of chemical mechanical polishing, and then the bottom oxide film is etched away. A first-layer P-type sub-column 301 and a first-layer N-type sub-column 203 are formed. The first-layer P-type sub-column 301 and the first-layer N-type sub-column 203 are adjacent, so as to form a first P-N-type column, i.e., a first layer of super junction substructure, charges of which reach a balance or the difference in the charge amount is less than 5% of the total charge amount of the first-layer P-type sub-column 301, and also less than 5% of the total charge amount of the first-layer P-type sub-column 301.

Figure 4:
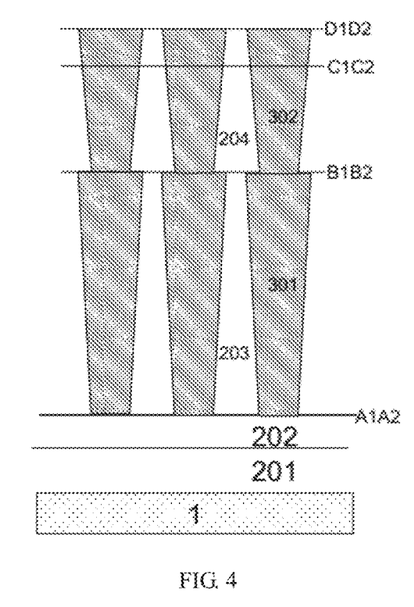

Step 21 to step 23 are repeated to form a second P-N-type column, i.e., a second layer of super junction substructure, referring to FIG. 4, and a second-layer P-type sub-column 302 and a second-layer N-type sub-column 204 are formed. The bottom of the second-layer P-type sub-column 302 is necessarily in contact with the top of the first-layer P-type sub-column 301, and can penetrate the first-layer P-type sub-column 301 to a certain depth. The resistivity of an epitaxial layer corresponding to the second-layer N-type sub-column 204 is set to be the same as or different from the resistivity of the epitaxial layer 203. The second-layer P-type sub-column 302 and the second-layer N-type sub-column 204 are adjacent, so as to form a second P-N-type column, charges of which reach a balance or the difference in the charge amount is less than 5% of the total charge amount of the second-layer N-type sub-column 204, and also less than 5% of the total charge amount of the second-layer P-type sub-column 302.

Figure 5:
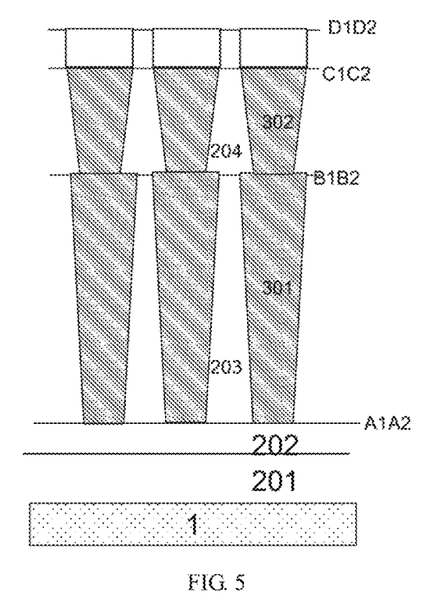

Step 3. Front side processes are completed, including the following:

Referring to FIG. 5, a P-type well 6 is formed, wherein the P-type well 6 is formed on the top of each P-type column, and the P-type well 6 extends into the N-type columns on both sides. The top surface of the P-type well 6 is shown by line D1D2, and the bottom surface is shown by line C1C2; after the P-type well 6 is formed, the top surface of the second layer of super junction substructure is lowered to the position shown by line C1C2.

Figure 6:
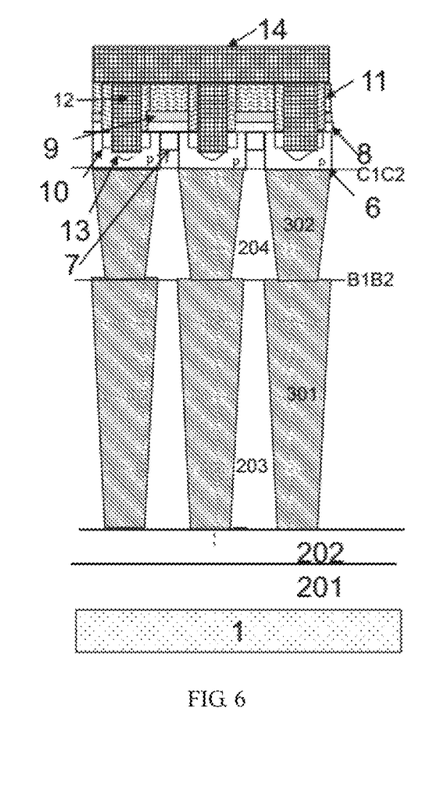

Referring to FIG. 6, a dielectric layer and polysilicon are formed and patterned to form a gate structure formed by stacking a gate dielectric layer, such as a gate oxide layer 8, and a polysilicon gate 9 on the top of the P-type well 6. In FIG. 6, the gate oxide layers 8 and the polysilicon gates 9 on the tops of two adjacent P-type wells 6 on both sides of the N-type column are respectively connected together to form integral structures.

N-type heavily doped ion implantation is performed to form a source region 10 in a surface region of the P-type well 6 on both sides of the polysilicon gate 9.

An interlayer film 11 is formed, and the interlayer film 11 covers the top of the polysilicon gate 9 and a region between the polysilicon gates 9.

A contact 12 passing through the interlayer film 11 is formed, and a contact P-type implantation region 13 is formed at the bottom of the contact on the top of the source region 10.

The contact 12 is formed by filling a contact opening with metal.

A front side metal layer 14 is formed and patterned to form a source and a gate. The source formed by the front side metal layer 14 is shown in FIG. 6.

Generally, in order to further reduce the on-resistance, a JFET implantation region 7 is formed by means of ion implantation in a surface region of the N-type column between the P-type wells 6.

Figure 7:
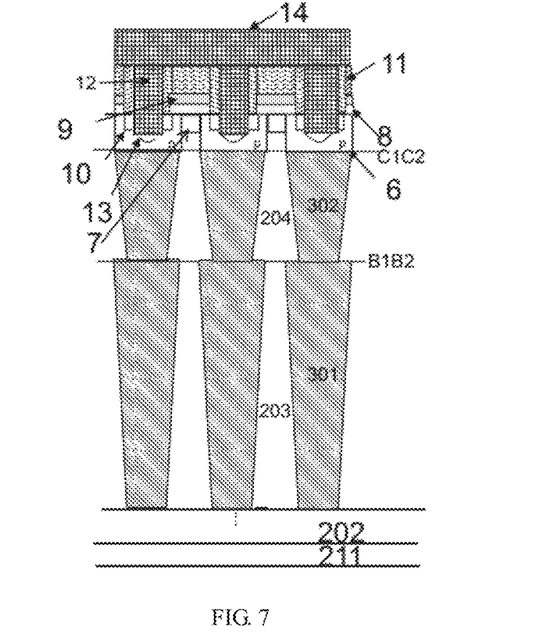

Subsequently, the following backside processes are performed:

Step 31. Referring to FIG. 7, a backside thinning process is performed, wherein the backside thinning process removes the N-type semiconductor substrate 1.

The N-type redundant epitaxial layer 201 is partially removed in the backside thinning process; the remaining N-type redundant epitaxial layer is individually marked with mark 211, and a drain region subsequently formed in the remaining N-type redundant epitaxial layer is also marked with mark 211. The N-type redundant epitaxial layer 201 may also be completely removed.

The thickness of the N-type buffer layer 202 remains intact after the backside thinning process.

In the backside thinning process, the N-type redundant epitaxial layer 201 is used to ensure that the backside thinning process can completely remove the N-type semiconductor substrate 1 without affecting the N-type buffer layer 202.

Figure 8:
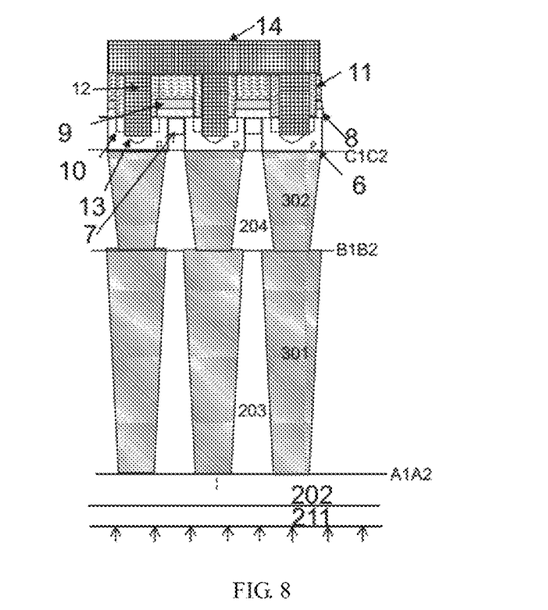

Step 32. Backside N-type ion implantation is performed to form a drain region 211, wherein the N-type redundant epitaxial layer 201 also ensures that the drain region 211 can reach a required doping concentration.

An impurity of the backside N-type ion implantation includes phosphorus or arsenic. In some examples, the backside N+ impurity concentration can form a good ohmic contact with a subsequent backside metal layer 15, and the proportion of contact resistance in the on-resistance of the device is less than 1%, which is negligible, while the N+ impurity concentration remains at a relatively low level.

The implantation energy of the backside N-type ion implantation can be set to 20-100 Kev, in some example, 30-75 Kev; the implantation dose can be set to $5E12/cm^2$-$5E15/cm^2$, in some example, $5E13/cm^2$-$1e15/cm^2$. Then, implanted ions in the backside region are activated by laser annealing.

Subsequently, the backside metal layer 15 is deposited on the backside of the drain region 211, and the backside metal layer 15 may be a Ti layer, a Ni layer, or an Ag layer. The thickness can be set to 1000 Å for the Ti layer, 1000-2000 Å for the Ni layer, and 10000 Å for the Ag layer.

The present application is described above in detail via specific embodiments, but these embodiments are not intended to limit the present application. Without departing from the principle of the present application, those skilled in the art can make many modifications and improvements, which shall also be regarded as the protection scope of the present application.

What is claimed is:

1. A method for manufacturing a super junction device, comprising the following steps:
    step 1: sequentially forming an N-type redundant epitaxial layer and an N-type buffer layer on an N-type semiconductor substrate,
    wherein a resistivity of the N-type semiconductor substrate is 0.1-10 times a resistivity of a subsequent top epitaxial layer, so as to ensure that doping impurity outdiffusion of the N-type semiconductor substrate does not affect a performance of a super junction structure, and
    a resistivity of the N-type redundant epitaxial layer is 0.1-10 times the resistivity of the N-type semiconductor substrate, and the resistivity of the N-type redundant epitaxial layer is lower than a resistivity of the N-type buffer layer;
    step 2: forming the super junction structure on a surface of the N-type buffer layer by means of a trench filling process, wherein the super junction structure is formed by alternately arranging N-type columns and P-type columns, each P-type column is formed by a P-type semiconductor layer filling a trench, the trench is formed in the top epitaxial layer, and each N-type column is formed by the top epitaxial layer filling between the P-type columns; and
    step 3: completing front side processes, and then performing the following backside processes:
    step 31: performing a backside thinning process, wherein the backside thinning process removes the N-type semiconductor substrate, the N-type redundant epitaxial layer is completely or partially removed in the backside thinning process, and a thickness of the N-type buffer layer remains intact after the backside thinning process, and
    in the backside thinning process, the N-type redundant epitaxial layer is used to ensure that the backside thinning process can completely remove the N-type semiconductor substrate without affecting the N-type buffer layer; and
    step 32: performing backside N-type ion implantation to form a drain region, wherein the N-type redundant epitaxial layer also ensures that the drain region can reach a required doping concentration.

2. The method for manufacturing the super junction device according to claim 1, wherein the resistivity of the N-type buffer layer is 0.5-2 times the resistivity of the top epitaxial layer.

3. The method for manufacturing the super junction device according to claim 2, wherein the resistivity of the N-type buffer layer is equal to the resistivity of the top epitaxial layer.

4. The method for manufacturing the super junction device according to claim 2, wherein the resistivity of the N-type redundant epitaxial layer is less than 0.2 times the resistivity of the top epitaxial layer.

5. The method for manufacturing the super junction device according to claim 4, wherein the resistivity of the N-type redundant epitaxial layer is 0.1 times the resistivity of the top epitaxial layer.

6. The method for manufacturing the super junction device according to claim 1, wherein an impurity of the backside N-type ion implantation comprises phosphorus or arsenic, and an implantation dose is $5E12\ cm^{-2}$-$1E15\ cm^{-2}$.

* * * * *